(12) United States Patent
Dopadlo et al.

(10) Patent No.: US 11,824,340 B2
(45) Date of Patent: Nov. 21, 2023

(54) CONNECTION ARRANGEMENT FOR CONNECTING A BUSBAR TO A HOUSING

(71) Applicant: Eugen Forschner GmbH, Spaichingen (DE)

(72) Inventors: Martin Dopadlo, Spaichingen (DE); Heike Strumberger, Spaichingen (DE)

(73) Assignee: EUGEN FORSCHNER GMBH, Spaichingen (DE)

( * ) Notice: Subject to any disclaimer, the term of this patent is extended or adjusted under 35 U.S.C. 154(b) by 350 days.

(21) Appl. No.: 17/426,363

(22) PCT Filed: Jan. 23, 2020

(86) PCT No.: PCT/EP2020/051606
§ 371 (c)(1),
(2) Date: Jul. 28, 2021

(87) PCT Pub. No.: WO2020/156917
PCT Pub. Date: Aug. 6, 2020

(65) Prior Publication Data
US 2022/0102955 A1    Mar. 31, 2022

(30) Foreign Application Priority Data
Jan. 28, 2019   (DE) ..................... 10 2019 101 973.7

(51) Int. Cl.
| H05K 7/14 | (2006.01) |
| H02G 5/06 | (2006.01) |
| H02G 5/10 | (2006.01) |
| H05K 7/20 | (2006.01) |

(52) U.S. Cl.
CPC ................. *H02G 5/06* (2013.01); *H02G 5/10* (2013.01); *H05K 7/14329* (2022.08); *H05K 7/209* (2013.01)

(58) Field of Classification Search
CPC .............................. H05K 7/14329; H01R 9/18
See application file for complete search history.

(56) References Cited

U.S. PATENT DOCUMENTS

| 5,645,457 A   | * | 7/1997 | Hirayama ............. F16B 35/042 |
|               |   |        |                         439/949 |
| 8,743,532 B2  |   | 6/2014 | Yano et al. |
| 2003/0137813 A1 |   | 7/2003 | Onizuka et al. |

(Continued)

FOREIGN PATENT DOCUMENTS

| DE | 20 2008 016 048 U1 | 4/2010 |
| DE | 20 2019 000 282 U1 | 2/2019 |

(Continued)

*Primary Examiner* — Hung V Ngo
(74) *Attorney, Agent, or Firm* — Birch, Stewart, Kolasch & Birch, LLP

(57) ABSTRACT

The invention relates to a connection arrangement for connecting a busbar (40) to a housing (10) for electrical components (30), comprising the busbar (40) and at least one wall (11) of the housing (10) and at least one electrically insulating element (50), characterized in that the connection arrangement (20) has at least one fastening element (60; 61A; 62) for preferably detachable connection to the wall (11) of the housing (10) and the at least one electrically insulating element (50) is formed from a material having good thermal conductivity.

14 Claims, 3 Drawing Sheets

(56) References Cited

U.S. PATENT DOCUMENTS

Figure 1:
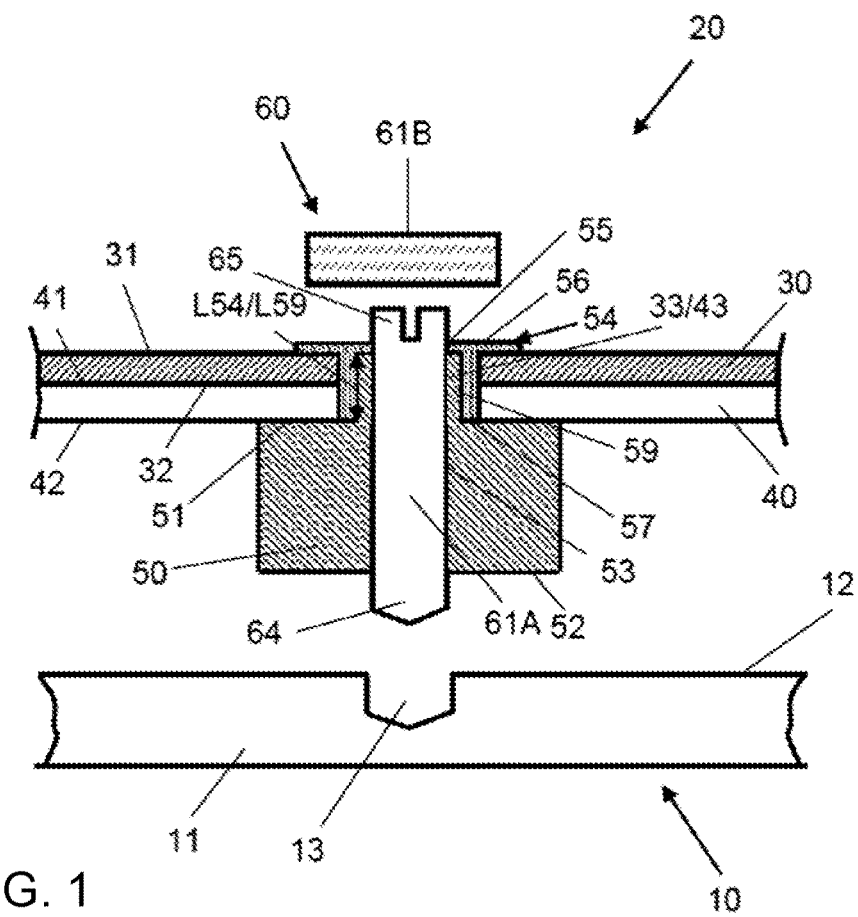

| | | | |
|---|---|---|---|
| 2004/0214477 A1* | 10/2004 | Ikeda | H01R 9/18 |
| | | | 439/709 |
| 2006/0039127 A1 | 2/2006 | West | |
| 2006/0239050 A1 | 10/2006 | Andersson et al. | |
| 2015/0101838 A1* | 4/2015 | Shepard | H05K 7/1432 |
| | | | 174/50 |
| 2017/0201083 A1 | 7/2017 | Amar et al. | |
| 2019/0006775 A1* | 1/2019 | Kan | H01R 9/18 |
| 2019/0020285 A1 | 1/2019 | Kobolla et al. | |
| 2019/0045635 A1* | 2/2019 | Chin | H05K 1/0203 |
| 2019/0348828 A1* | 11/2019 | Preising | H05K 7/1432 |
| 2020/0219642 A1 | 7/2020 | Goepfert et al. | |
| 2022/0037871 A1* | 2/2022 | Hoffmann | H05K 7/20454 |
| 2022/0192053 A1* | 6/2022 | Shouda | H05K 7/20927 |
| 2023/0114288 A1* | 4/2023 | Kanematsu | H01R 9/18 |
| | | | 439/731 |
| 2023/0163541 A1* | 5/2023 | Ellensohn | H01R 13/516 |
| | | | 439/750 |

FOREIGN PATENT DOCUMENTS

| | | |
|---|---|---|
| DE | 10 2017 217 150 A1 | 3/2019 |
| DE | 20 2019 000 478 U1 | 4/2019 |
| EP | 0 935 286 A1 | 8/1999 |
| EP | 2 871 921 B1 | 11/2017 |
| FI | 12030 U1 | 4/2018 |
| FI | 12031 U1 | 4/2018 |

\* cited by examiner

CONNECTION ARRANGEMENT FOR CONNECTING A BUSBAR TO A HOUSING

The invention relates to a connection arrangement for connecting a busbar to a housing, according to the preamble of claim 1.

A connection arrangement of the generic type is known from EP 2 871 921 B1. Described therein is a housing for electrical components, comprising an electrically insulating body, a housing body and a busbar. In that case, the housing body and the electrically insulating body are integrally connected to one another, and the busbar is embedded in the electrically insulating body. The claimed connection arrangement is thus not designed to be taken apart in a non-destructive manner, which is a significant disadvantage for maintenance and/or repair work as well as for recycling.

The object of the invention is to create a connection arrangement that conducts heat well and is easy to assemble.

This object is achieved according to the invention by a connection arrangement having the features of claim 1. Advantageous designs of the invention are specified in the dependent claims.

One field of application of the invention is, for example, applications in the automotive sector, in particular applications in electromobility.

The present invention makes it possible to create a connection arrangement with good thermal conductivity that is easy to repair, for fastening a busbar and optionally other electrical, electromechanical or electronic components—such as fuses or contactors—to a wall of a housing. The term "busbar" within the meaning of this invention also includes other electrically conductive components.

The connection arrangement according to the invention comprises a busbar, at least one wall of a housing, at least one electrically insulating element and at least one fastening element serving to connect the busbar to the housing.

The invention is characterized in that the connection arrangement has at least one fastening element for connection to the wall of the housing, and in that the at least one electrically insulating element is made of a material that has good thermal conductivity. A material having good thermal conductivity has, for example, a conductivity from about 1.5 W/(m·K) or more.

A detachable connection arrangement is particularly advantageous in the case of maintenance and/or repair work, and also in the case of recycling. Having the electrically insulating element at the same time made from a material that has good thermal conductivity enables the heat generated in the busbar to be dissipated toward the wall of the housing, and thus prevents overheating of the busbar, at least one electrical component arranged in the housing and other electrical components arranged therein.

According to an advantageous development of the invention, the connection arrangement has at least one through-going fastening element. In this case, the busbar and the electrically insulating element, and optionally also an electrical component connected to the busbar, can be connected to the wall of the housing simultaneously, i.e. by means of the at least one through-going fastening element.

In an alternative realization of the invention, the connection arrangement has at least two fastening elements, wherein at least one first fastening element connects the busbar, optionally the electrical component, and the electrically insulating element to one another, and a second fastening element connects the electrically insulating element to the wall of the housing. In this case, the fastening of the busbar is effected in two steps, the electrically insulating element first being connected to the wall of the housing, and the busbar then being connected to the electrically insulating element.

In advantageous exemplary embodiments, the connection arrangement in this case comprises at least one screw and/or at least one threaded rod and/or at least one rivet and/or at least one clamping bolt, as well as, respectively associated therewith, at least one nut and/or at least one threaded sleeve and/or at least one press bushing. Furthermore, the connection arrangement may also comprise an adhesive connection. In alternative exemplary embodiments, a combination of a plurality of the aforementioned fastening elements may also be used. Particularly advantageously, the connection arrangement is also designed to be separable from the housing again for recycling purposes.

In a further advantageous exemplary embodiment, the connection arrangement has a metal element that can be connected to the electrically insulating element.

In an advantageous development of the fastening arrangement according to the invention, the electrically insulating and thermally highly conductive element is formed by a plastic block, a plastic disk or a plastic layer preferably injection-molded onto the busbar, for example of polypropylene (PP), polyphthalamide (PPA), polyamide (in particular PA 6, PA 66 or PA 12), thermoplastic copolyester (COPE), polyphenylene sulfide (PPS), liquid crystal polymer (LCP), thermoplastic elastomers (TPE), polycarbonate/acrylonitrile butadiene styrene (PC/ABS blend), polyetheretherketone (PEEK), polyetherimide (PEI) or polybutylene terephthalate (PBT). Ceramic and/or mineral fillers such as, for example, aluminum oxide or boron nitride, are preferably added to these plastics to improve thermal conductivity. Examples of particularly suitable materials for the electrically insulating and thermally highly conductive element are:

- Laticonther® 82 CP1/800, PA12, with a thermal conductivity of 9.5 W/(m*K),
- Laticonther® 62 CP6-V0HF1, PA 6, with a thermal conductivity of 4 W/(m*K),
- Laticonther® 52 CP1/60, PPH, with a thermal conductivity of 6 W/(m*K),
- CoolPoly® D5506, Thermally Conductive Liquid Crystalline Polymer (LCP), with 10 W/(m*K), or
- CoolPoly® D3612, Thermally Conductive Polyamide (PA), with 6 W/(m*K).

(Laticonther® is a registered trademark of LATI INDUSTRIA TERMOPLASTICI SPA, IT; CoolPoly® is a registered trademark of Ticona Polymers, Inc., US).

Alternatively, the electrically insulating and thermally highly conductive element may also be formed by an oxidic or non-oxidic ceramic material.

Of the oxidic ceramic materials, particularly suitable in this case are, for example:
- aluminum oxide,
- ZTA (Zirconia Toughened Alumina) materials, or
- ATZ (Alumina Toughened Zirconia) materials.

Of the non-oxidic ceramic materials, particularly suitable in this case are, for example:
- aluminum nitride,
- silicon carbide, or
- silicon nitride.

In a further advantageous embodiment, the electrically insulating element is realized as a sleeve that insulates the busbar, and optionally an electrical component connected to it, from the through-going fastening element. The connection arrangement according to the invention thereby also advantageously allows compensation of thermal expansions of the busbar. In alternative exemplary embodiments, a plurality of electrically insulating elements may also be arranged. Thus, for example, in addition to the sleeve, a plastic disk or a ceramic plate may also form part of the connection arrangement.

In a particularly advantageous development, the electrically insulating element is simultaneously realized as a fastening element or as part of a fastening element.

In a further particularly advantageous development, the electrically insulating element has at least one hole. This at least one hole may in this case be realized as a blind hole or a through-hole between two opposite sides of the electrically insulating element. Both the through-hole and the blind hole may in this case be realized with or without a countersink.

Advantageously, the at least one wall of the housing is designed as a cooling plate. In this case, at least one blind hole may be realized on an inner side of the wall, for fastening the connection arrangement to the housing. The blind hole may in this case be realized as a thread for receiving a screw or threaded rod, or with a smooth surface for receiving a rivet or press-in bolt. Depending on the particular exemplary embodiment, therefore, the connection arrangement be screwed or fastened to the wall of the housing by pressing or by adhesive bonding. As a result of the connection arrangement being fastened to the cooling plate, heat can thus be transferred from the busbar and/or from the electrical component to the housing, such that both active and passive cooling can be realized.

In addition, heat dissipation via the connection arrangement according to the invention also makes it possible to reduce the conductor cross-sections of the busbar, resulting in a reduction in the overall weight of the assembled housing.

The housing is in particular formed by a housing of a device for power distribution and/or for power conversion, which is sometimes also referred to in the art as a power distribution unit (PDU) or power distribution module (PDM), and comprises at least one DC/DC converter and further high-voltage components.

Figure 2:
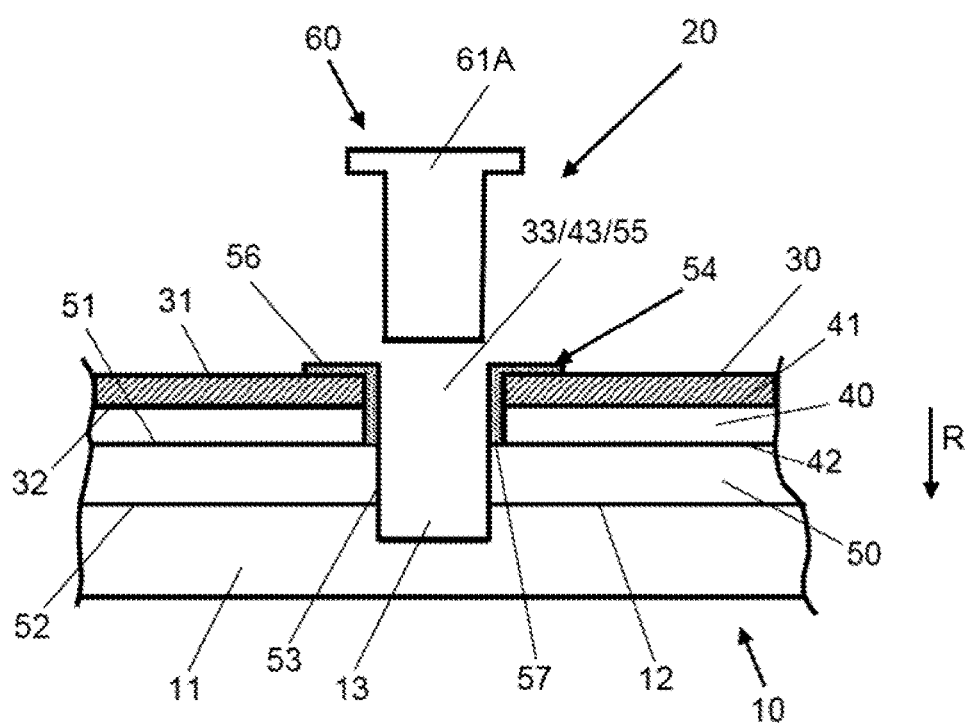
Figure 3:
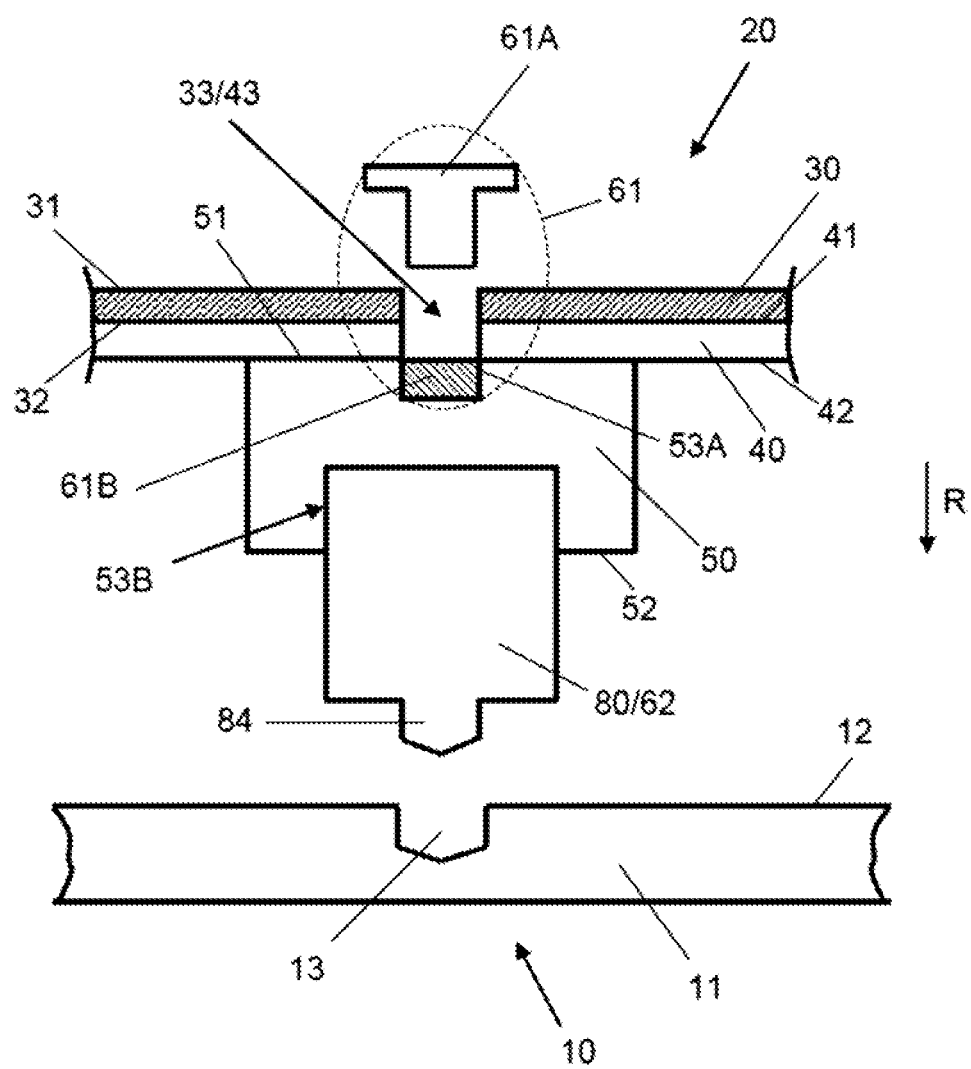
Figure 4:
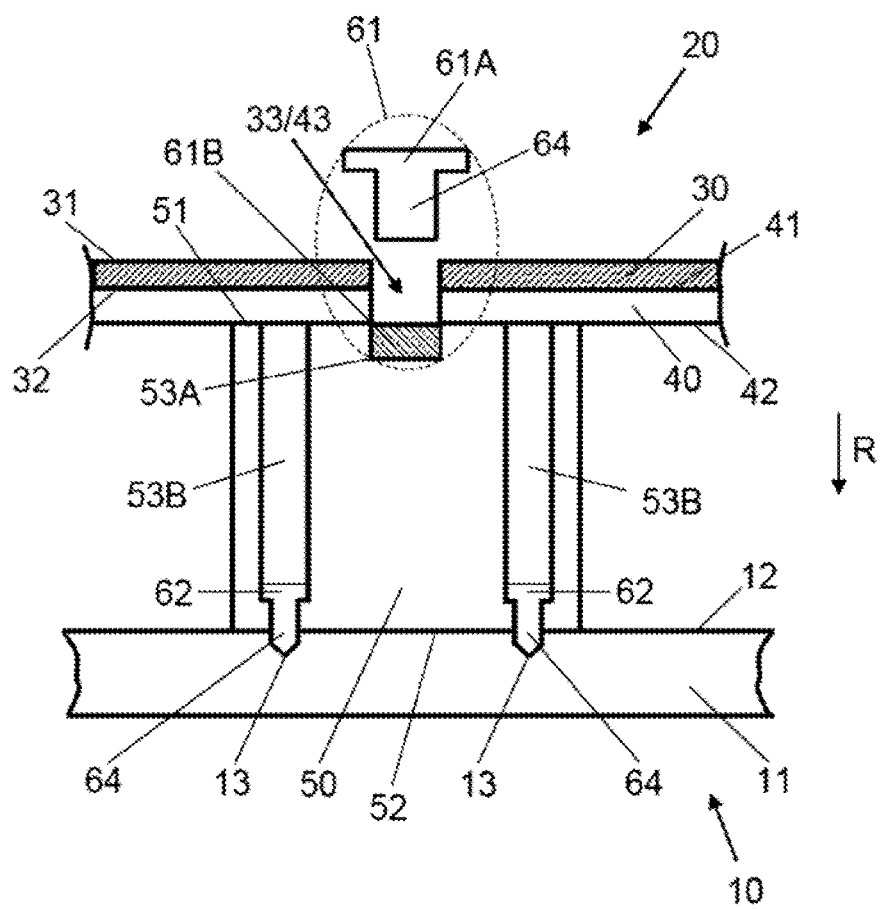
Figure 5:
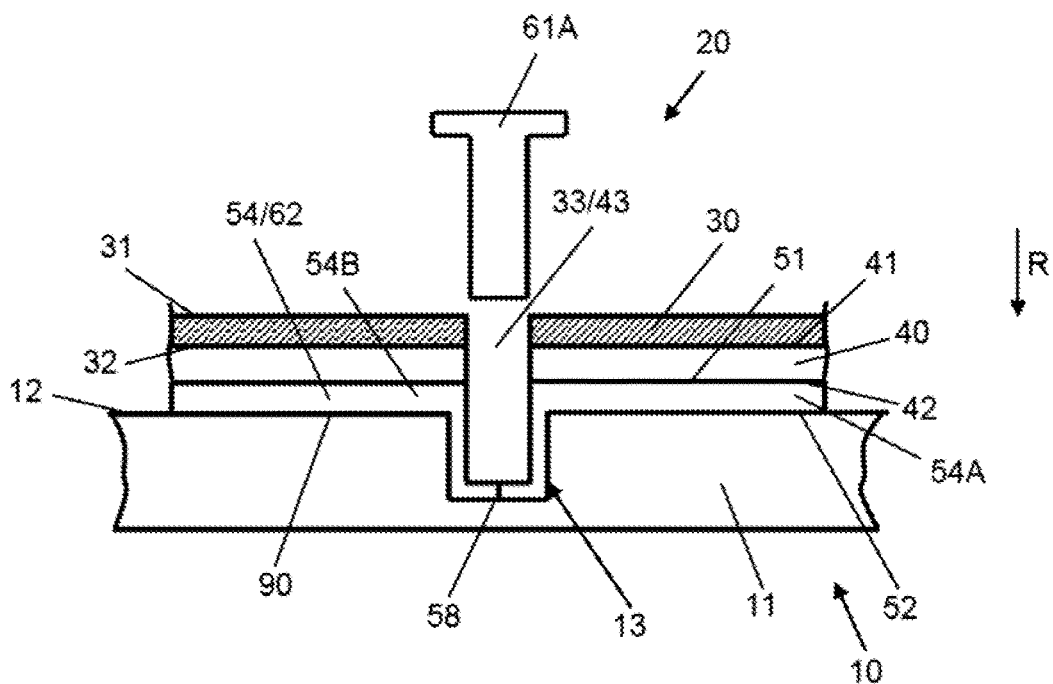

Exemplary embodiments of the invention are explained in greater detail in the following with reference to the drawings. There are shown:

FIG. 1 a first exemplary embodiment of a connection arrangement having a through-going fastening element;

FIG. 2 a second exemplary embodiment of a connection arrangement having a through-going fastening element;

FIG. 3 a first exemplary embodiment of a connection arrangement having at least two fastening elements;

FIG. 4 a second exemplary embodiment of a connection arrangement having at least two fastening elements, and FIG. 5 a third exemplary embodiment of a housing comprising a connection arrangement having two fastening elements.

FIG. 1 shows a first exemplary embodiment of a housing 10 comprising a connection arrangement 20 having a through-going fastening element 60. An electrical component 30 is arranged above a busbar 40, and this in turn is arranged above an electrically insulating element 50, which is in the shape of a plastic block. Since during operation the temperature of the busbar can rise to 120° C., it is provided according to the invention that the electrically insulating element 50 is designed to be thermally highly conductive. A material having good thermal conductivity has, for example, a conductivity from about 1.5 W/(m-K) or more.

In all of the exemplary embodiments represented in FIGS. 1 to 5, the electrically insulating and thermally highly conductive element 50 is formed by a plastic block, a plastic disk or a plastic layer preferably injection-molded onto the busbar 40, for example of polypropylene (PP), polyphthalamide (PPA), polyamide (in particular PA 6, PA 66 or PA 12), thermoplastic copolyester (COPE), polyphenylene sulfide (PPS), liquid crystal polymer (LCP), thermoplastic elastomers (TPE), polycarbonate/acrylonitrile butadiene styrene (PC/ABS blend), polyetheretherketone (PEEK), polyetherimide (PEI) or polybutylene terephthalate (PBT).

Ceramic and/or mineral fillers such as, for example, aluminum oxide or boron nitride, are preferably added to these plastics to improve thermal conductivity.

Examples of particularly suitable materials for the electrically insulating and thermally highly conductive element 50 are:
Laticonther® 82 CP1/800, PA12, with a thermal conductivity of 9.5 W/(m*K),
Laticonther® 62 CP6-V0HF1, PA 6, with a thermal conductivity of 4 W/(m*K),
Laticonther® 52 CP1/60, PPH, with a thermal conductivity of 6 W/(m*K),
CoolPoly® D5506, Thermally Conductive Liquid Crystalline Polymer (LCP), with 10 W/(m*K), or
CoolPoly® D3612, Thermally Conductive Polyamide (PA). with 6 W/(m*K).

Alternatively or additionally, the electrically insulating and thermally highly conductive element may also be formed by an oxidic or non-oxidic ceramic material.

Of the oxidic ceramic materials, particularly suitable in this case are, for example:
aluminum oxide,
ZTA (Zirconia Toughened Alumina) materials, or
ATZ (Alumina Toughened Zirconia) materials.

Of the non-oxidic ceramic materials, particularly suitable in this case are, for example:
aluminum nitride,
silicon carbide, or
silicon nitride.

The electrical component 30, the busbar 40 and the electrically insulating element 50 have a hole 33 or 43 or 53, respectively, each of which is realized as a through-hole. During assembly, a sleeve 54 made of electrically insulating material is passed through the holes 33 and 43 in an assembly direction R, as a result of which a collar 56 of the sleeve 54 is brought into bearing contact with a first side 31 of the electrical component 30, and a lower edge 57 of the sleeve 54 is flush with a second side 42 of the busbar 40. Advantageously, the sleeve 54 also at the same time allows compensation of thermal expansions of the busbar 40.

The electrically insulating element 50 has, on a first side 51, a shaft 59 that surrounds the hole 53 and is arranged inside the sleeve 54. A length L59 of the shaft 59 corresponds in this case to a length L54 of the sleeve 54. Thus, the lower edge 57 of the sleeve 54 also bears against the first side 51 of the electrically insulating element 50.

The through-going fastening element 60, which in FIG. 1 is formed by a first fastening means 61A, can be passed through a hole 55 in the sleeve 54 and the through-hole 53 of the electrically insulating element 50.

In the exemplary embodiment shown, the first fastening element 61A is formed by a threaded rod. In alternative exemplary embodiments, this may also be formed by a screw or a rivet or a clamping bolt.

In the exemplary embodiment shown, fastening the first fastening means 61A, realized as a threaded rod in FIG. 1, through the through-hole 53 of the electrically insulating element 50 is effected by means of screwing. For this purpose, realized at an upper end 65 of the first fastening means 61A there is a receiver or a socket for a tool, which in the example shown in FIG. 1 is formed by a slot for a screwdriver.

Alternatively, the first fastening means 61A can also be fastened in the electrically insulating element 50 by pressing-in, bonding or encapsulation, as shown in FIG. 3.

For the purpose of fastening the connection arrangement 20 to a wall 11 of the housing 10, the first fastening means 61A is inserted into a blind hole 13 that is arranged on an inner side 12 of the wall 11. In the exemplary embodiment shown, the blind hole 13 is realized as a threaded hole, such that a thread 64 of the first fastening means 61A can be fastened in the blind hole 13. A second side 52 of the electrically insulating element 50 is thus pressed against the inner side 12 of the wall 11, which according to the invention is realized as a cooling plate.

In order to ensure a reliable connection of the connection arrangement 20 to the wall 11 of the housing 12, the upper end 65 of the first fastening means 61A is screwed tightly by means of a second fastening means 61B realized in the manner of a nut. As a result, the collar 56 of the sleeve 54 is pressed onto the first side 31 of the electrical component 30, and a second side 32 of the electrical component 30 is pressed onto a first side 41 of the busbar 40.

The transfer of heat thus rendered possible between the electrical component 30, the busbar 40 and the wall 11 of the housing 10 effects both active and passive cooling. In this way, overheating of the electrical components 30 or 40 arranged in the housing 10 can be avoided.

In the second exemplary embodiment of a connection arrangement 20 with a continuous fastening element 60, shown in FIG. 2, the electrically insulating element 50 is realized as a plastic disk and/or as a ceramic plate made of one or more of the materials already described above.

In this exemplary embodiment also, the electrical component 30, the busbar 40 and the electrically insulating element 50 have holes 33 and 43 and 53, respectively, realized as through-holes. During assembly, the sleeve 54 is passed through the holes 33 and 43 in an assembly direction R, as a result of which a collar 56 of the sleeve 54 is brought into bearing contact with a first side 31 of the electrical component 30, and the lower edge 57 of the sleeve 54 is flush with the second side 42 of the busbar 40. Advantageously, the sleeve 54 also allows compensation of thermal expansions of the busbar 40.

Since, in the exemplary embodiment shown, the electrically insulating element 50 is in the form of a plate, the busbar 40 can be in bearing contact with the electrically insulating element 50 over a large area, and thus dissipate the heat, generated in the busbar 40, over a larger area than in the first exemplary embodiment shown, via the electrically insulating element 50, to the wall 11 of the housing 10, which is realized a cooling plate. The use of an electrically insulating element 50 realized as a plate also makes it possible to reduce the overall height of the connection arrangement 20.

In the shown exemplary embodiment according to FIG. 2 also, fastening of the connection arrangement 20 to the wall 11 of the housing 10 is effected by means of a through-going fastening element 60, the fastening means 61A of which is realized a rivet, and therefore the blind hole 13 in the wall 11 is realized with a smooth surface.

The connection arrangement 20 can therefore be connected to the wall 11 by a form-fit in the form of cold rivets, or by a force-fit in the form of hot rivets. Alternatively, however, fastening by means of a screw connection is also possible in this case.

FIG. 3 shows an exemplary embodiment of a connection arrangement 20 having at least two fastening elements 61 and 62. In this case, the first fastening element 61 is formed by a first fastening means 61A and a second fastening means 61B, and the fastening element 62 is formed by a metal element 80.

The first fastening means 61A extends through the holes 33 and 43 of the electrical component 30 and of the busbar 40, and engages in a hole 53A realized on the first side 51 of the electrically insulating element 50 that is a good conductor of heat. This hole is realized as a blind hole, arranged in which there is a second fastening means 61B. The first fastening means 61A in this case may be realized as a screw or as a threaded rod or as a clamping bolt. The fastening means 61B, which serves as a counterpart, may be realized, for example, as a nut or as a threaded sleeve or as a press bush. In this exemplary embodiment also, the fastening means 61B, if at least partially made of plastic—for example a plastic sheath—can also advantageously allow compensation of thermal expansions of the busbar 40.

The metal element 80 is arranged in a second hole 53B on the second side 52 of the electrically insulating element 50, which is likewise realized as a blind hole. The metal element 80 in this case be fastened in the electrically insulating element 50 by, for example, encapsulation or screwing-in or by bonding. In the exemplary embodiment shown, the electrically insulating element 50 having good thermal conductivity is formed as a plastic block.

In the case of the connection arrangement 20 having at least two fastening elements 61 and 62, there is no need for a sleeve 54 as an insulating element that insulates the electrical component 30 and the busbar 40 from the fastening element 60. Direct contact between the through-going fastening element 60 and the wall 11 of the housing 10 does not occur in this connection arrangement 20 because the electrically insulating element 50 having good thermal conductivity does not have a through-hole in this case, and thus completely insulates the busbar 40 and the fastening element 60 and 61A, respectively, from the wall 11.

In FIG. 3, the connection arrangement 20 is connected to the wall 11 of the housing 10 in that a thread 84 of the metal element 80 is screwed into the tapped blind hole 13. Alternatively, the screw connection may also be replaced here by a press connection or an adhesive connection.

FIG. 4 shows a second exemplary embodiment of a connection arrangement 20 having with at least two fastening elements 61 and 62. In this case the connection arrangement 20 is connected to the wall 11 of the housing 10 in two steps. In the first step, the electrically insulating element 50 is fastened to the wall 11 of the housing by means of at least two second connection elements 62. For this purpose, these are guided into two holes 53B provided in the electrically insulating element 50, the upper region of which is larger in diameter than a through-hole located in the lower region. The two second connection elements 62 in this case are preferably realized as screws. The electrical component 30 and the busbar 40 are connected by means of the first fastening element 61 in a manner similar to that of FIG. 3.

The exemplary embodiment described in FIG. 5 is a third variant of fastening by means of at least two fastening elements 61 or 62. In FIG. 5, the first fastening element 61 is realized as a fastening means 61A, for example having a fir-tree profile for pressing into a correspondingly shaped receiver. Furthermore, the electrically insulating element 50 is realized as a sleeve 54, having a first sleeve half 54A and a second sleeve half 54B. The sleeve halves 54A and 54B can be joined together at a butt joint 58, which may be effected, for example, by means of an adhesive bond or by welding. The sleeve 54 may likewise be realized in one piece and pressed into the blind hole 13 in the wall 11. The inner surface of the sleeve 54 is preferably realized with a fir-tree profile running in the opposite direction to the fir-tree profile of the first fastening element 61, such that the profiles interlock positively upon being pressed-in. Alternatively, other forms of fastening are also possible here, such as screwing into a nut formed in or received in the sleeve 54.

In the exemplary embodiment shown in FIG. 5, the sleeve 54 is simultaneously realized as an electrically insulating element 50 and as a second fastening element 62. An adhesive bond 90 connects the second side 52 of the electrically insulating element 50 to the inner side 12 of the wall 11 of the housing 10. In this exemplary embodiment, the sleeve 54 also advantageously allows compensation of thermal expansions of the busbar.

According to a further embodiment, not represented, the electrically insulating element 50 having good thermal conductivity may also be formed by a layer of plastic and/or ceramic that, for example as an encapsulation, may partially or completely surround the busbar 50 outside of its intended contact regions.

LIST OF REFERENCES 10 housing
11 wall
12 inner side (of 11)
13 blind hole
20 connection arrangement
30 electrical component
31 (first) side
32 (second) side
33 hole
40 busbar
41 (first) side
42 (second) side
43 hole
50 insulating element (having good thermal conductivity)
51 (first) side
52 (second) side
53 hole
53A hole
53B hole
54 sleeve
54A (first) sleeve half
54B (second) sleeve half
55 hole (in 54)
56 collar (of 54)
57 lower edge
58 parting joint/butt joint
59 shaft (of 50)
60 fastening element
61 first fastening element
61A (first) fastening means
61B (second) fastening means
62 second fastening element
64 thread
65 upper end
80 metal element
81 thread
90 adhesive bond
L54 length (of 54)
L59 length (of 59)
R assembly direction

The invention claimed is:

1. A connection arrangement for connecting a busbar (40) to a housing (10) for electrical components (30), comprising the busbar (40) and at least one wall (11) of the housing (10) and at least one electrically insulating element (50), wherein the connection arrangement (20) has at least one fastening element (60; 61A; 62) for connection to the wall (11) of the housing (10), and the at least one electrically insulating element (50) is made of a material that has good thermal conductivity, of more than 1.5 W/(m·K) characterized in that the connection arrangement (20) has at least two fastening elements (60; 61A; 62), wherein a first fastening element (61A) connects the busbar (40) and the electrically insulating element (50) to one another, and a second fastening element (62) connects the electrically insulating element (50) to the wall (11) of the housing (10).

2. The connection arrangement as claimed in claim 1, characterized in that an electrical component (30) can be simultaneously fastened, with the busbar (40), to the wall (11) of the housing (10).

3. The connection arrangement as claimed in claim 1, characterized in that the connection arrangement (20) has at least one through-going fastening element (60; 61A) for connecting the busbar (40), the electrically insulating element (50) and the wall (11) of the housing (10).

4. The connection arrangement as claimed claim 1, characterized in that the connection arrangement (20) comprises a screw, a threaded rod, a rivet or a clamping bolt as a fastening element (60).

5. The connection arrangement as claimed in claim 1, characterized in that the connection arrangement (20) comprises a nut, a threaded sleeve or a press bushing.

6. The connection arrangement as claimed in claim 1, characterized in that the connection arrangement (20) comprises an adhesive bond (90).

7. The connection arrangement as claimed in claim 1, characterized in that the connection arrangement (20) has at least one metal element (80) that can be connected to the electrically insulating element (50).

8. The connection arrangement as claimed in claim 1, characterized in that the electrically insulating element (50) is formed by a plastic block or a plastic disk or a ceramic plate.

9. The connection arrangement as claimed in claim 1, characterized in that the electrically insulating element (50) is realized as a sleeve (54) that insulates the busbar (40) from the fastening element (60).

10. The connection arrangement as claimed in claim 1, characterized in that the electrically insulating element (50) is simultaneously realized as a fastening element (62).

11. The connection arrangement as claimed in claim 1, characterized in that the electrically insulating element (50) is fixedly arranged, as at least one layer, on the busbar (40).

12. The connection arrangement as claimed in claim 1, characterized in that the wall (11) of the housing (10) is realized as a cooling plate.

13. The connection arrangement as claimed in claim 1, characterized in that the connection arrangement (20) has at least one element (54; 61B) that allows compensation of thermal expansion of the busbar (40).

14. The connection arrangement as claimed in claim 1, characterized in that realized on an inner side (12) of the wall (11) there is at least one blind hole (13) for fastening the connection arrangement (20) to the housing (10).

* * * * *